(12) United States Patent
Tran et al.

(10) Patent No.: US 10,153,416 B1
(45) Date of Patent: Dec. 11, 2018

(54) PACKAGE BODY AND LIGHT EMITTING DEVICE USING SAME

(71) Applicant: Radiant Choice Limited, The Valley (AI)

(72) Inventors: Nguyen The Tran, Anaheim, CA (US); Jiun-Pyng You, Irvine, CA (US)

(73) Assignee: RADIANT CHOICE LIMITED, The Valley (AI)

( * ) Notice: Subject to any disclaimer, the term of this patent is extended or adjusted under 35 U.S.C. 154(b) by 0 days.

(21) Appl. No.: 15/879,576

(22) Filed: Jan. 25, 2018

Related U.S. Application Data

(60) Provisional application No. 62/509,761, filed on May 23, 2017.

(51) Int. Cl.
| | |
|---|---|
| *H01L 33/00* | (2010.01) |
| *H01L 33/62* | (2010.01) |
| *H01L 33/46* | (2010.01) |
| *H01L 33/60* | (2010.01) |
| *H01L 33/38* | (2010.01) |
| *H01L 23/495* | (2006.01) |

(52) U.S. Cl.
CPC ........ *H01L 33/62* (2013.01); *H01L 23/49582* (2013.01); *H01L 33/382* (2013.01); *H01L 33/465* (2013.01); *H01L 33/60* (2013.01)

(58) Field of Classification Search
CPC combination set(s) only.
See application file for complete search history.

(56) References Cited

U.S. PATENT DOCUMENTS

| | | | | |
|---|---|---|---|---|
| 2007/0200133 | A1* | 8/2007 | Hashimoto | H01L 33/486 257/100 |
| 2011/0291143 | A1* | 12/2011 | Kim | H01L 33/56 257/98 |
| 2013/0011617 | A1* | 1/2013 | Tasaki | B29C 45/14 428/148 |

FOREIGN PATENT DOCUMENTS

JP 2012074753 A * 4/2012 ............. H01L 33/60

* cited by examiner

*Primary Examiner* — Mamadou Diallo
(74) *Attorney, Agent, or Firm* — Locke Lord LLP; Tim Tingkang Xia, Esq.

(57) ABSTRACT

A package body for a semiconductor device includes a lead frame, an insulating package, and a reflective coating layer. The lead frame has a first electrode and a second electrode separated from each other. The insulating package provides a housing structure and forming a package cavity therein. The package cavity has a reflective side surface formed by the insulating package. The reflective coating layer partially covers the first electrode and the second electrode and forms a reflective bottom surface of the package cavity. Each of the first electrode and the second electrode may have an angled cut. The insulating package may be made of a binder-filler composite containing white pigments. The package body may be an all diffusive integrated reflecting surfaces (AR-IRS) package body, and may be used in an encapsulant-free semiconductor package.

24 Claims, 18 Drawing Sheets

PACKAGE BODY AND LIGHT EMITTING DEVICE USING SAME

CROSS-REFERENCE TO RELATED PATENT APPLICATION

This application claims priority to and the benefit of, pursuant to 35 U.S.C. § 119(e), U.S. provisional patent application Ser. No. 62/509,761, filed May 23, 2017, which is incorporated herein by reference in its entirety.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference is individually incorporated by reference.

FIELD

The present disclosure relates generally to liquid crystal displays, and more particularly to a package body with all diffusive integrated reflecting surfaces (AD-IRS) for a light emitting device, and a light emitting device using the AD-IRS package body.

BACKGROUND

The background description provided herein is for the purpose of generally presenting the context of the present disclosure. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the present disclosure.

A light emitting device (LED), sometimes also referred to as a light emitting diode, is a sort of semiconductor device that changes electricity into infrared rays or light by using the characteristics of compound semiconductors to input/output a signal, which may be used as a light source. Typically, a LED package includes a package body, also referred to as a lead frame package, and one LED chip (or multiple LED chips) electrically connected to terminals of the package body via small metal wires such as gold wires. For example, in a semiconductor device using a conventional lead frame package, the a conventional package body may have a lead frame substrate that is typically coated with a metal such as silver, which functions as a lead frame, and a thermoplastic body that is made of thermoplastic resin and formed on and around the lead frame substrate. The thermoplastic body may form a reflecting cup, which has a bottom reflecting surface on the surface of the lead frame substrate. However, the thermoplastic resin of the thermoplastic body has little adhesion with the lead frame substrate, and the resin part of the thermoplastic body and the lead frame substrate are likely to be detached. Further, the interface between the reflecting cup of the thermoplastic body and the bottom reflecting surface on the lead frame substrate shows potential for gas leakage due to the low adhesion between these two materials, as disclosed in U.S. Pat. No. 8,530,250. Moreover, the metal coating of the lead frame is very expensive and time consuming. The metal coating also causes long-term reliability issues such as sulfidation on silver plating which reduces the optical output. Conventional LED package also has an encapsulating layer that covers the LED chip (or LED chips) and fills the cavity of the lead frame or the chip-on-board package. The encapsulating layer usually has low thermal dissipation property that restricts heat flow.

Generally, LED package design involves the simultaneous integration and balancing of many different design factors including optical, thermal, mechanical, and electrical challenges. Designing of LED package becomes more challenging to ensure the reliability of an LED package as the demand of power per package area increases. High power density per unit area could lead to material failures including delamination of integrated parts of LED package and degradation of reflectivity and optical properties of materials.

Therefore, a heretofore unaddressed need exists in the art to address the aforementioned deficiencies and inadequacies.

SUMMARY

In one aspect, the invention relates to a package body for a semiconductor device. In one embodiment, the package body includes a lead frame having a first electrode and a second electrode separated from each other; an insulating package providing a housing structure and forming a package cavity therein, where the package cavity has a reflective side surface formed by the insulating package; and a reflective coating layer partially covering the first electrode and the second electrode and forming a reflective bottom surface of the package cavity.

In one embodiment, the package body is an all diffusive integrated reflecting surfaces (AR-IRS) package body.

In one embodiment, the first electrode and the second electrode are separated by the insulating package.

In one embodiment, each of the first electrode and the second electrode has an angled cut such that a bottom surface area of the first electrode is smaller than a top surface area of the first electrode, and a bottom surface area of the second electrode is smaller than a top surface area of the second electrode.

In one embodiment, each of the first electrode and the second electrode has a vertical cut.

In one embodiment, at least one semiconductor chip is configured to be attached to the first electrode and electrically connected to the first electrode and the second electrode respectively.

In one embodiment, the reflective coating layer has a first recess, a second recess and at least one chip recess formed thereon, where a portion of the lead frame is exposed through each of the at least one chip recess to provide a chip-attaching area, such that the at least one semiconductor chip is attached to the lead frame via the at least one chip recess; a portion of the first electrode is exposed through the first recess to provide a wire-bonding area, such that each of the at least one semiconductor chip is electrically connected to the first electrode through a first wire via the first recess; and a portion of the second electrode is exposed through the second recess to provide a wire-bonding area, such that each of the at least one semiconductor chip is electrically connected to the second electrode through a second wire via the second recess.

In one embodiment, the at least one semiconductor chip comprises a light emitting diode (LED) chip or a laser diode (LD) chip.

In one embodiment, the insulating package is made of a binder-filler composite containing white pigments.

In one embodiment, the binder-filler composite is polycyclohexylenedimethylene terephthalate (PCT), polyphthalamide (PPA), a silicone resin, a silicone molding resin, an epoxy molding resin, an acrylate resin, an urethane resin, or a copolymer system thereof, and the white pigments are made of at least one pigment selected from the group consisting of $TiO_2$, $SiO_2$, $Al_2O_3$, BN, MgO, CaO, $ZrO_2$, ZnO, BaO, AlN, $Sb_2O_3$, and $BaSO_4$.

In one embodiment, the white pigments are amorphous, partially crystalline, crystalline or a mixture thereof in any ratio, and the white pigments have a weight ratio from 1 to 95 percent of the binder-filler composite forming the insulating package.

In one embodiment, each of the white pigments has a size from 10 nm to 10 microns.

In one embodiment, the reflective coating layer is made of the same binder-filler composite forming the insulating package.

In one embodiment, the reflective coating layer is made of a binder filler composite different from the binder-filler composite forming the insulating package.

Another aspect of the present invention relates to an encapsulant-free semiconductor package, which includes: a semiconductor flip-chip; and a package body as described above, where the reflective coating layer has at least one recess formed thereon, and a portion of the first electrode and a portion of the second electrode of the lead frame are exposed through the at least one recess to provide a bonding pad area, such that the semiconductor flip-chip is attached to the first electrode and the second electrode via the at least one recess.

In one embodiment, the semiconductor flip-chip is a light emitting diode (LED) flip-chip or a laser diode (LD) flip-chip.

In one embodiment, the LED flip-chip or the LD flip-chip is configured to emit a blue light, a green light, a red light or a white light.

In one embodiment, the semiconductor flip-chip is coated with a thin coating of a transparent material.

In one embodiment, the semiconductor flip-chip is configured to emit light in a first color, and the transparent material comprises a light conversion material to partially convert the light emitted by the semiconductor flip-chip to a second color different from the first color.

A further aspect of the present invention relates to a method for forming a package body as described above. In certain embodiments, the method includes: providing a lead frame array; punching or etching the lead frame array to form a plurality of electrode separating gaps and a plurality of package gaps; forming the insulating package and the reflective coating layer on the lead frame array to form a semiconductor package array; and dicing or singulating the package body from the package array along the package gaps, where one of the electrode separating gaps separates the first electrode and the second electrode of the lead frame of the package body.

In one embodiment, the method further includes: forming a coating on the lead frame array to cover at least exposed areas of the lead frame of the package body.

In one embodiment, the insulating package and the reflective coating layer are formed by transfer molding, compressing molding or injection molding.

A further aspect of the present invention relates to a LED device, which includes the package body as described above, and a LED chip attached to the package body.

Yet a further aspect of the present invention relates to a package body for a semiconductor device, which includes: a substrate; a first electrode and a second electrode formed on the substrate and separated from each other; an insulating package providing a housing structure and forming a package cavity therein, where the package cavity has a reflective side surface formed by the insulating package; and a reflective coating layer forming a reflective bottom surface of the package cavity and partially covering the first electrode and the second electrode.

In one embodiment, the first electrode and the second electrode are formed by a lead frame.

In one embodiment, a semiconductor flip-chip is configured to be attached to the first electrode and the second electrode respectively.

In one embodiment, the reflective coating layer has at least one recess formed thereon, and a portion of the first electrode and a portion of the second electrode of the lead frame are exposed through the at least one recess to provide a bonding pad area, such that the semiconductor flip-chip is attached to the first electrode and the second electrode via the at least one recess.

In one embodiment, at least one semiconductor chip is configured to be attached to the first electrode and electrically connected to the first electrode and the second electrode respectively.

In one embodiment, the reflective coating layer has a first recess, a second recess and at least one chip recess formed thereon, where a portion of the lead frame is exposed through each of the at least one chip recess to provide a chip-attaching area, such that the at least one semiconductor chip is attached to the lead frame via the at least one chip recess; a portion of the first electrode is exposed through the first recess to provide a wire-bonding area, such that each of the at least one semiconductor chip is electrically connected to the first electrode through a first wire via the first recess; and a portion of the second electrode is exposed through the second recess to provide a wire-bonding area, such that each of the at least one semiconductor chip is electrically connected to the second electrode through a second wire via the second recess.

According to certain embodiments of the invention, the package body provides highly optical and reliable reflecting surfaces at the side and bottom of the package cavity, thus improving optical output and reliability of the semiconductor package.

These and other aspects of the invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The accompanying drawings illustrate one or more embodiments of the invention and, together with the written description, serve to explain the principles of the invention.

Wherever possible, the same reference numbers are used throughout the drawings to refer to the same or like elements of an embodiment.

DETAILED DESCRIPTION

Figure 1:
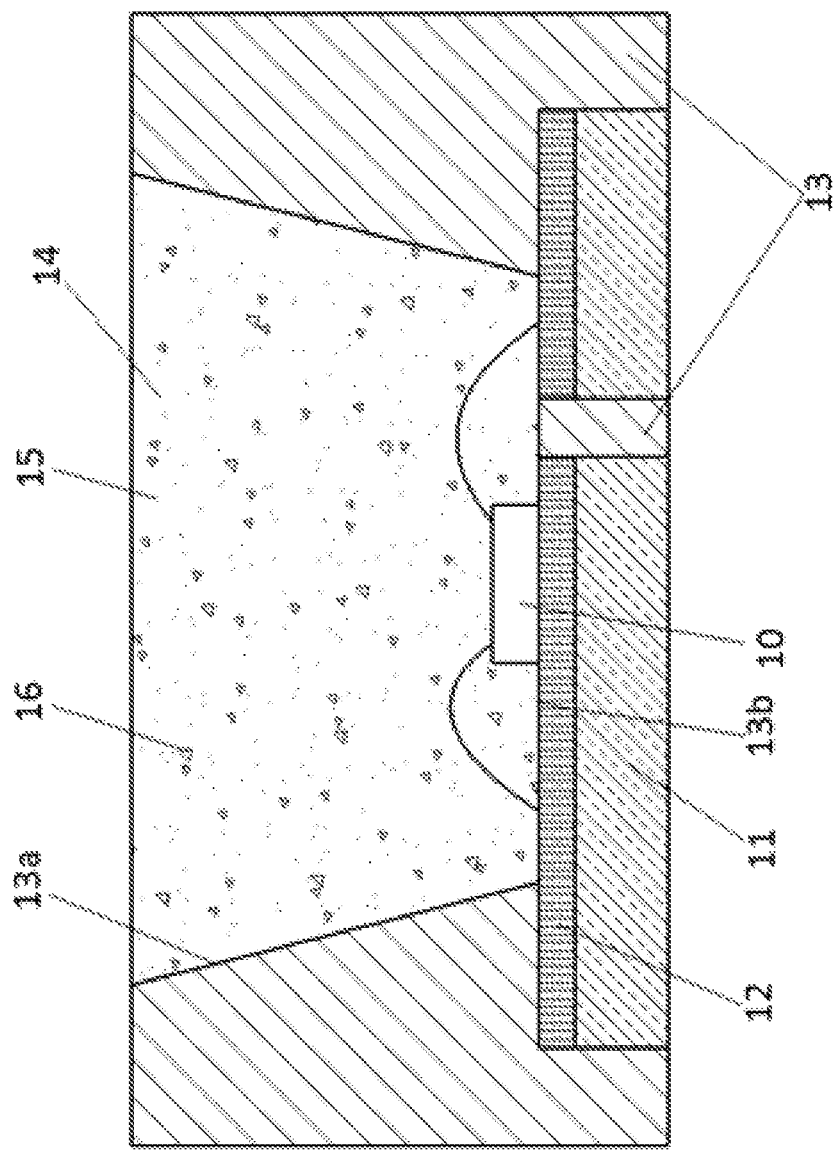
FIG. 1 is a schematic cross-sectional view of a semiconductor device using a lead frame package according to one embodiment of the invention.

The disclosure will now be described more fully hereinafter with reference to the accompanying drawings, in which exemplary embodiments of the disclosure are shown. This invention may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the disclosure or of any exemplified term. Likewise, the disclosure is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the disclosure.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" to another feature may have portions that overlap or underlie the adjacent feature.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top", may be used herein to describe one element's relationship to another element as illustrated in the figures. It will be understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the terms "comprise" or "comprising", "include" or "including", "carry" or "carrying", "has/have" or "having", "contain" or "containing", "involve" or "involving" and the like are to be understood to be open-ended, i.e., to mean including but not limited to.

As used herein, the phrase "at least one of A, B, and C" should be construed to mean a logical (A or B or C), using a non-exclusive logical OR. It should be understood that one or more steps within a method may be executed in different order (or concurrently) without altering the principles of the disclosure.

Typically, terms such as "about," "approximately," "generally," "substantially," and the like unless otherwise indicated mean within 20 percent, preferably within 10 percent, preferably within 5 percent, and even more preferably within 3 percent of a given value or range. Numerical quantities given herein are approximate, meaning that the term "about," "approximately," "generally," or "substantially" can be inferred if not expressly stated.

Embodiments of the invention are illustrated in detail hereinafter with reference to accompanying drawings. It should be understood that specific embodiments described herein are merely intended to explain the invention, but not intended to limit the invention. In accordance with the purposes of this invention, as embodied and broadly described herein, this invention, in certain aspects, relates to a package body and a LED device using the same.

FIG. 1 shows a semiconductor device using a lead frame package according to one embodiment of the invention. As shown in FIG. 1, the package body has a lead frame substrate 11 that is typically coated with a lead frame 12 which is made of a metal such as silver, and a thermoplastic body 13 that is made of thermoplastic resin and formed on and around the lead frame substrate 11. The thermoplastic body 13 forms a reflecting cup 14, which is a cavity that has a bottom reflecting surface 13b on the surface of the lead frame 12. The lead frame 12 includes two separate portions which are separated by a part of the thermoplastic body 13, and each portion functions as an electrode. A semiconductor chip 10 is disposed on the lead frame 12 and electrically connected to the two electrodes respectively via metal wires. Moreover, an encapsulating layer 15 is filled in the reflecting cup 14 to encapsulate the semiconductor chip 10, and the encapsulating layer 15 may be formed of a binder-filler composite, which includes a binder material and filler particles 16. A reflecting side surface 13a is provided between the thermoplastic body 13 and the encapsulating layer 15.

However, in the package body as shown in FIG. 1, the thermoplastic resin of the thermoplastic body 13 and the lead frame 12 are likely to be detached due to the little adhesion between the thermoplastic resin of the thermoplastic body 13 and the lead frame 12. Further, due to the low adhesion between the two different materials, the interface between the reflecting cup 14 of the thermoplastic body 13 and the bottom reflecting surface 13b may be potentially detached for a gas leakage. Moreover, as discussed above, the encapsulating layer 15 usually has low thermal dissipation property that restricts heat flow, thus reducing the thermal dissipation efficiency of the semiconductor device.

Figure 2A:
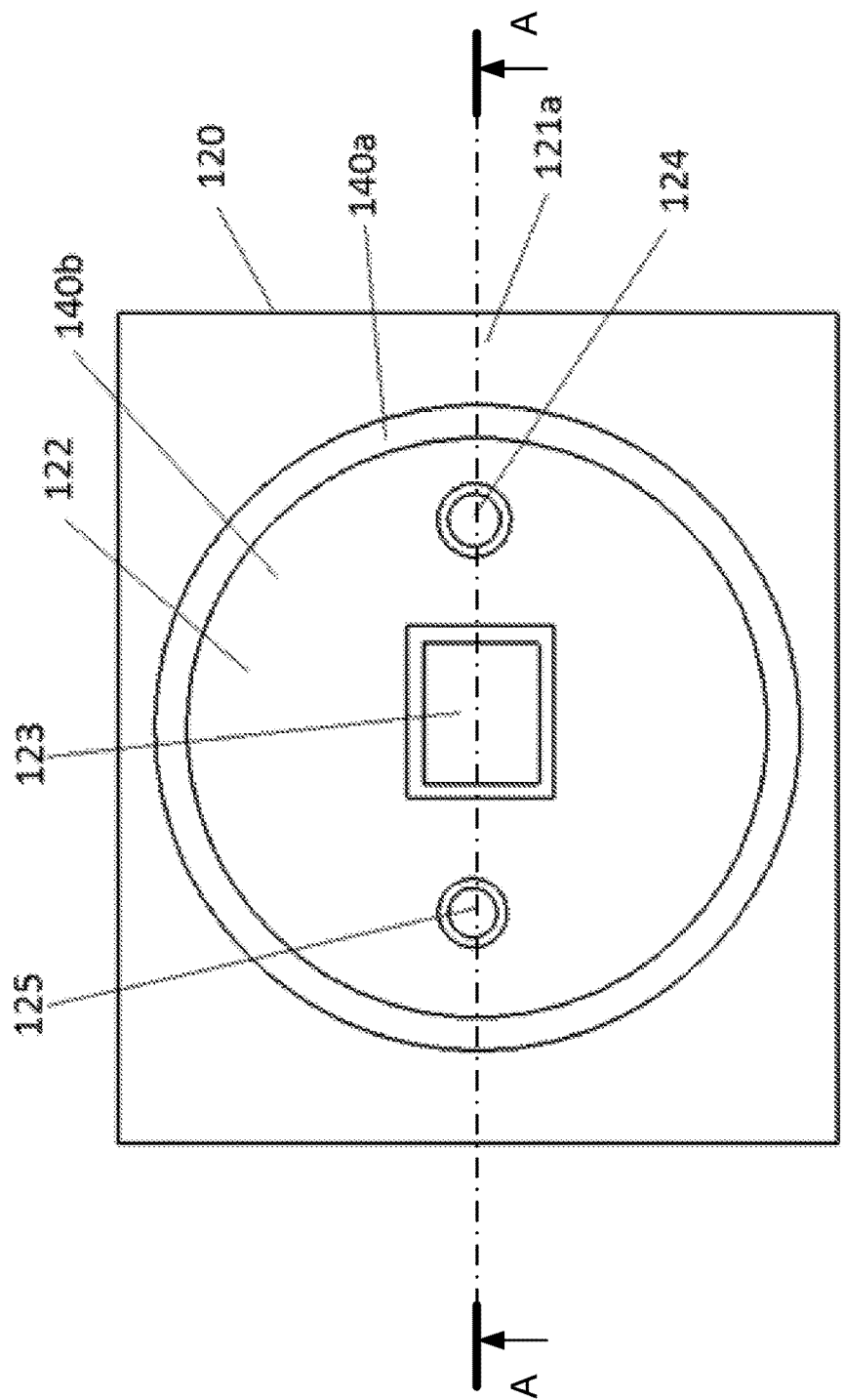
FIG. 2A is a schematic top view of a semiconductor package structure according to one embodiment of the invention.
Figure 2B:
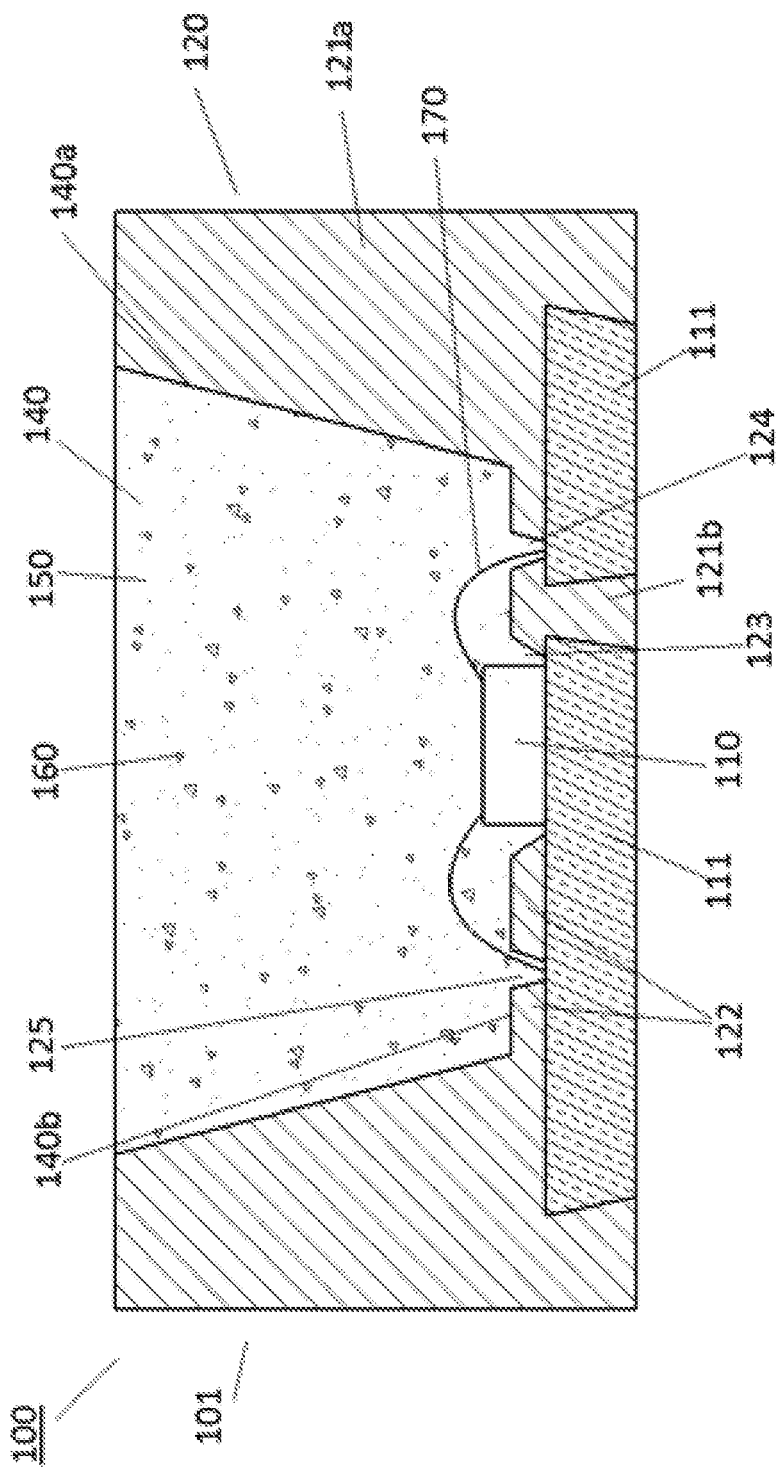
FIG. 2B is a schematic cross-sectional view along the line A-A of the semiconductor package structure as shown in FIG. 2A.

To address the aforementioned deficiencies and inadequacies, certain aspects of the invention are directed to a semiconductor device, which utilized an all diffusive integrated reflecting surfaces (AR-IRS) package body as the package body for the semiconductor device. For example, FIG. 2A is a schematic top view of a semiconductor package structure according to one embodiment of the invention. FIG. 2B is a schematic cross-sectional view along the line A-A of the semiconductor package structure as shown in FIG. 2A. Specifically, the semiconductor package structure as shown in FIGS. 2A and 2B is a single package structure, which may be formed by dicing a semiconductor package array. In other words, the semiconductor package structure as shown in FIGS. 2A and 2B may be formed after a singulation or dicing process.

As shown in FIGS. 2A and 2B, the semiconductor device 100 includes an AD-IRS package body 101, a semiconductor chip 110 attached in the package body 101, and an optical encapsulating resin layer 150. The AD-IRS package body 101 includes a lead frame 111, an insulating package 120, and a reflective coating layer 122. The semiconductor chip 110 can be any semiconductor chip. For example, when the semiconductor device 100 is a light emitting diode (LED) device, the semiconductor chip 110 can be a LED chip. Alternatively, when the semiconductor device 100 is a laser diode (LD) device, the semiconductor chip 110 can be a LD chip. The lead frame 111 includes two electrodes (namely a first electrode and a second electrode) separated from each other, for providing electrical contacts for the semiconductor chip 110 via the gold wires 170. The insulating package 120 provides a housing structure, which forms a package cavity 140 therein, such that the optical encapsulating resin layer 150 is filled in the package cavity 140 to encapsulate the semiconductor chip 110. In certain embodiments, the package cavity 140 functions as a reflective cup, which may have different shapes. In certain embodiments, the insulating package 120 includes a lateral region 121a that forms the main support of the package body 101, and a bottom region 121b that forms between the two electrodes of the lead frame 111 to electrically insulates the two electrodes from each other. The package cavity 140 has a reflective side surface 140a formed by the lateral region 121a. Further, the reflective coating layer 122 is disposed at a horizontal region extended from the insulating package 120 that partially covers the top surface of the lead frame 111, and forms a reflective bottom surface 140b of the package cavity 140. In other words, the reflective coating layer 122 partially covers the two electrodes of the lead frame 111.

In certain embodiments, the lead frame 111 may have angled cuts, with the larger cut being on the bottom side of the lead frame 111, such that the lead frame 111 (i.e., the two electrodes) can be strongly held to the insulating package 120 to avoid detaching from the insulating package 120. For example, as shown in FIG. 2B, each of the two electrodes of the lead frame 111 has an angled cut, such that a bottom surface area of each electrode is smaller than a top surface area of each electrode, thus increase bonding of each electrode of the lead frame 111 to the insulating package 120. In certain embodiments, the lead frame 111 can have vertical cuts or angled cuts.

In certain embodiments, the lead frame 111 may have vertical cuts.

As discussed above, the package cavity 140 functions as a reflective cup, which can have different shapes. In certain embodiments, the package cavity 140 can be shaped as an inverted truncated cone, as shown in FIGS. 2A and 2B. In certain embodiments, the package cavity 140 can be formed in other shapes, such as an inverted truncated pyramid, an inverted truncated pyramid with round corners, a parabolic shape, or other suitable shapes.

The insulating package 120 and the reflective coating layer 122 are formed to provide highly optical reflecting surfaces and reliable reflecting surfaces, including the reflective side surface 140a and the reflective bottom surface 140b, thus improving the optical output and reliability of the semiconductor device 100. In certain embodiments, the insulating package 120 may be a resin package. In certain embodiments, the reflective coating layer 122 and the insulating package 120 may be made of the same material. In this case, the reflective coating layer 122 can be essentially an extended horizontal portion of the insulating package 120, which improves the bonding and holding of the lead frame 111 to the insulating package 120 and strengthens the electrically-separating region 121b of the insulating package 120 to mechanically enhance the holding of the lead frame 111 to the insulating package 120, thus improving reliability of the semiconductor device 100. In contrast, as shown in the package body as shown in FIG. 1, the electrical-separating region of the thermoplastic body 13 (which corresponds to the electrically-separating region 121b of the insulating package 120) only contacts with the lead frame 11 at small vertical sides between the two electrodes of the lead frame 11.

As shown in FIGS. 2A and 2B, the reflective coating layer 122 (i.e., the extended horizontal region of the insulating package 120) covers the lead frame 111 with a plurality of openings 123, 124 and 125 to expose the lead frame 111 for semiconductor chip attaching area and wire-bonding areas. Specifically, the openings include a chip recess 123, a first recess 125 and a second recess 124. The size of the chip recess 123 is relatively small, and large enough to expose a portion of the lead frame 111 and provide a chip-attaching area, such that the semiconductor chip 110 can be attached to the lead frame 111 via the chip recess 123. Each of the first recess 125 and the second recess 124 is formed on one of the two electrodes of the lead frame 111 such that a portion of each electrode is exposed to provide a wire-bonding area, such that the semiconductor chip 110 can be electrically connected to the two electrodes through two wires via the first recess 125 and the second recess 124, respectively. Specifically, as shown in FIGS. 2A and 2B, the chip recess 123, the first recess 125 and the second recess 124 forms multiple exposed regions on the lead frame 111, and none of the exposed regions expose the electrode separating gap (where the bottom region 121b of the insulating package 120 is located) between two electrodes, so that mechanical bonding between the electrodes of the lead frame 111 and the insulating package 120 can be improved to avoid lead frame detachment and failure as well as leaking. The single electrode exposure of the exposed region of the chip recess 123 can enable a symmetrical shape of the exposed region 123 to prevent optical output with non-symmetrical intensity distribution that causes challenge in designing optical components in some applications such as secondary optics for backlighting in liquid crystal display. In certain embodiments, the shape of the chip recess 123 can be an inverted truncated cone to provide a rotational symmetrical shape around a vertical axis. In certain embodiments, the shape of the chip recess 123 can have a polyhedron that can be viewed as being made by cutting the reflective coating layer 122 (i.e., the extended horizontal region of the insulating package 120) by extruding a polygon vertically. In certain embodiments, the polyhedron can be tapped outwardly.

As shown in FIGS. 2A and 2B, the reflective coating layer 122 includes only one chip recess 123. However, in certain embodiments, the semiconductor device 100 may include multiple semiconductor chips 110. In this case, the reflective coating layer 122 may include multiple chip recesses 123 to enable the semiconductor device 100 with multiple semiconductor chips 110.

In certain embodiments, reflective coating materials may be used to enhance the reflectivity of the reflective side surface 140a and the reflective bottom surface 140b of the package cavity 140. For example, in one embodiment, the reflective coating layer 122 can be a coating layer of a high light reflectivity material that covers the entire bottom and/or top surfaces of the two electrodes of the lead frame 111. In one embodiments, the surface of the lead frame 111 at the opening 123 can be plated with a high reflectivity material. In one embodiment, the surface of the lead frame 111 can be plated with the high reflectivity material. Examples of the high reflectivity material may include, without being limited thereto, silver, metal alloy, gold, tin, tin alloy, aluminum, or a combination thereof.

In certain embodiments, the insulating package 120 can be made of a binder-filler composite, which includes at least one binder and at least one filler. In comparison to the conventional silver/metal coating, the binder-filler composite coating can provide better reliability and higher reflectivity. Further, the binder-filler composite coating can also act as a passive cooling agent of the package body, so that it can prolong the lifetime of the semiconductor package. In certain embodiments, the binder can be thermosetting or thermoplastic binders, and can be polymer resins or inorganic binders. In certain embodiments, the filler can be white pigments. In certain embodiments, the insulating package 120 can be formed by transfer molding, compression molding, or injection molding. In certain embodiments, the binder-filler composite may also include a catalyst, an additive and/or an solvent. In certain embodiments, the composition of resins can be, but not limited to, polycyclohexylenedimethylene terephthalate (PCT), polyphthalamide (PPA), silicone resin, silicone molding resin, epoxy molding resin, acrylate resin, urethane resin, or a copolymer system thereof. In certain embodiments, the white pigment fillers are made of at least one pigment selected from the group consisting of $TiO_2$, $SiO_2$, $Al_2O_3$, BN, MgO, CaO, $ZrO_2$, ZnO, BaO, AlN, $Sb_2O_3$, and $BaSO_4$. In certain embodiments, the white pigments can be amorphous, partially crystalline, crystalline or a mixture in any ratio. In certain embodiments, the composition of the white pigments in the binder-filler composite is between 1 to 95 weight percent of the total composite. In other words, the white pigments may have a weight ratio from 1 to 95 percent of the binder-filler composite. In certain embodiments, the optical reflectivity of the binder-filler composite may be at least 80% at a wavelength ranging from 350 to 1000 nm, and the filler (e.g., the white pigments) can have a size from 10 nm to 10 microns to achieve high light reflectivity.

In certain embodiments, the insulating package 120 and the reflective coating layer 122 can be formed in a one-step formation, in which the reflective coating layer 122 is formed together with the electrical-separating region 121$b$ and the main portion 121$a$ of the insulating package 120. In this case, the insulating package 120 and the reflective coating layer 122 may be made of the same material. For example, the insulating package 120 and the reflective coating layer 122 may be made of the same binder-filler composite. Alternatively, in certain embodiments, the reflective coating layer 122 can be formed separately from other regions of the insulating package 120. For example, the reflective coating layer 122 may be formed by coating on top of the lead frame 111 before the insulating package 120 is formed. In this case, the reflective coating layer 122 and the insulating package 120 can be made of the same material, or can be made of different materials. For example, the reflective coating layer 122 can be made of a binder filler composite different from the binder-filler composite forming the insulating package 120.

As shown in FIGS. 2A and 2B, the semiconductor chip 110 is electrically connected to the two electrodes through two wires via the first recess 125 and the second recess 124, respectively. Alternatively, in certain embodiments, different chip mounting structures may be adopted for the electrical connections between the semiconductor chip 110 and the two electrodes. For example, the semiconductor chip 110 may be mounted as a vertical chip, where no wire is needed for electrically connected to the one of the electrode. In this case, only two recesses (i.e., one chip-attaching area and one wire-bonding area) may be required, and only one wire is required for electrically connecting the semiconductor chip 110 (i.e., the vertical chip) to the other electrode via the one wire-bonding area.

Figure 3A:
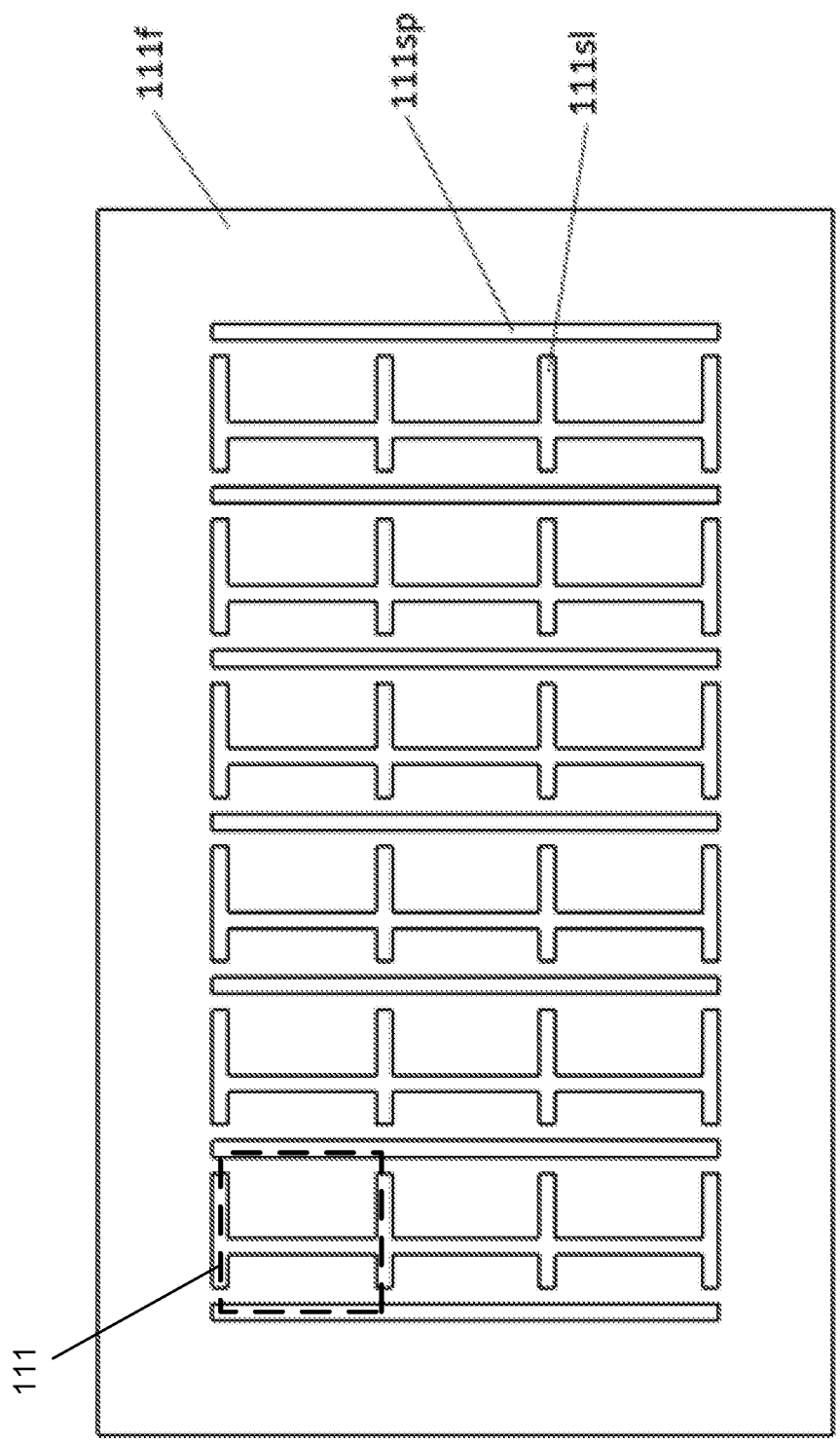
FIG. 3A is a schematic top view of a lead frame array before the semiconductor packages are made and diced according to one embodiment of the invention.
Figure 3B:
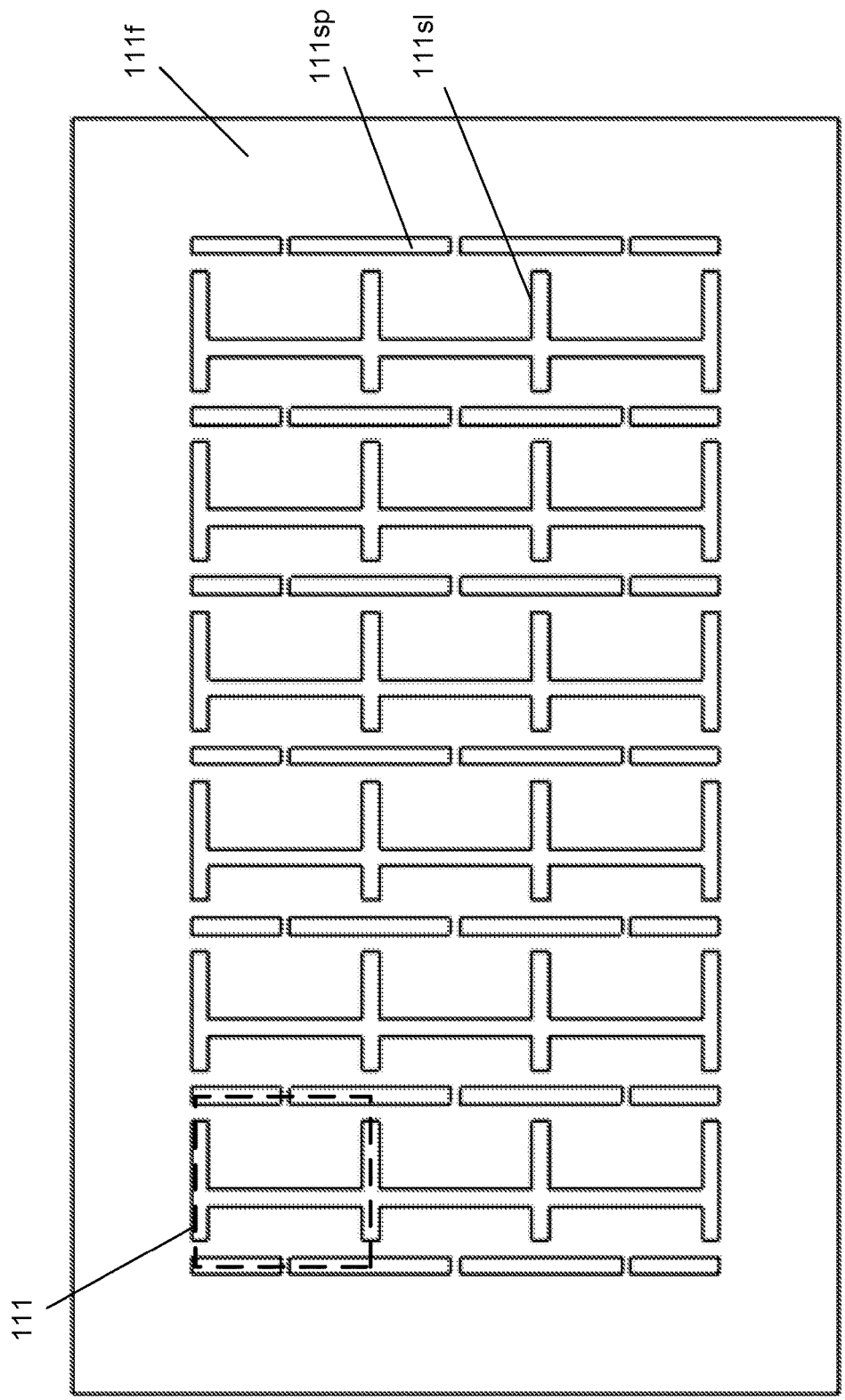
FIG. 3B is a schematic top view of a lead frame array before the semiconductor packages are made and diced according to a different embodiment of the invention.

In certain embodiments, the lead frame 111 can be formed by punching or etching a metal plate. In certain embodiments, in order to improve productivity of the semiconductor packages, the lead frame 111 can be made in an array. For example, FIG. 3A is a schematic top view of a lead frame array before the semiconductor packages are made and diced according to one embodiment of the invention. As shown in FIG. 3A, the lead frame array is made of a metal plate 111$f$, which includes an array of multiple lead frames 111 (for example, a lead frame 111 is shown in FIG. 3A by a dotted rectangle). The lead frame array includes multiple slots 111$sp$ and 111$sl$ thereon. The slots 111$sp$ and 111$sl$ are used to divide the multiple lead frames 111, and form the electrode separating gap between the two electrodes of each lead frame 111. Each of the slots 111$sp$, which is a vertically elongated slot, can separate a column of the lead frames 111 from each package, and enable less cutting for dicing the lead frame packages. Each of the slots 111$sl$, which include a vertically elongated slot and multiple horizontal slots, can enable electrically separation for the lead frames 111 in each column, and forms the electrode separating gap between the two electrodes. In other words, the slots 111$sp$ and the horizontal slots of the slots 111$sl$ forms the package gaps between the lead frames 111, which may enable less cutting of the lead frames 111 in the dicing or singulating process; and the vertical slot of the slots 111$sl$ forms the electrode separating gap between the two electrodes of each lead frame 111, so that the electrically-separating region 121$b$ of the insulating package 120 may be filled in the electrode separating gap to separate the two electrodes. FIG. 3B shows a different example of the lead frame array, where the shape of each of the slots 111$sp$ is different. Specifically, each the slots 111$sp$ as shown in FIG. 3B includes multiple vertically sectioned slots, instead of a single vertically elongated slot as shown in FIG. 3A.

Figure 4A:
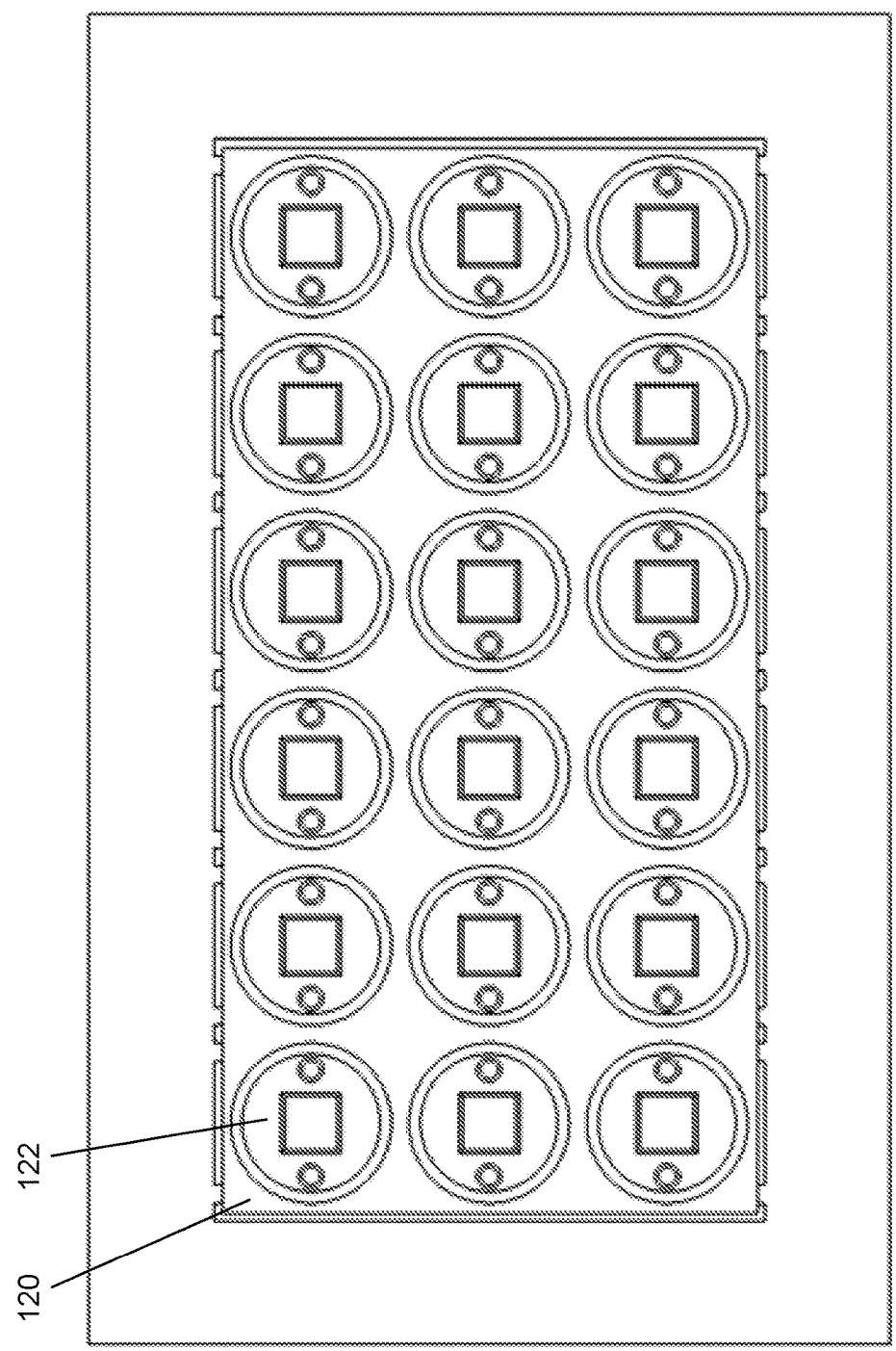
FIG. 4A is a schematic view of a semiconductor package array according to one embodiment of the invention.
Figure 4B:
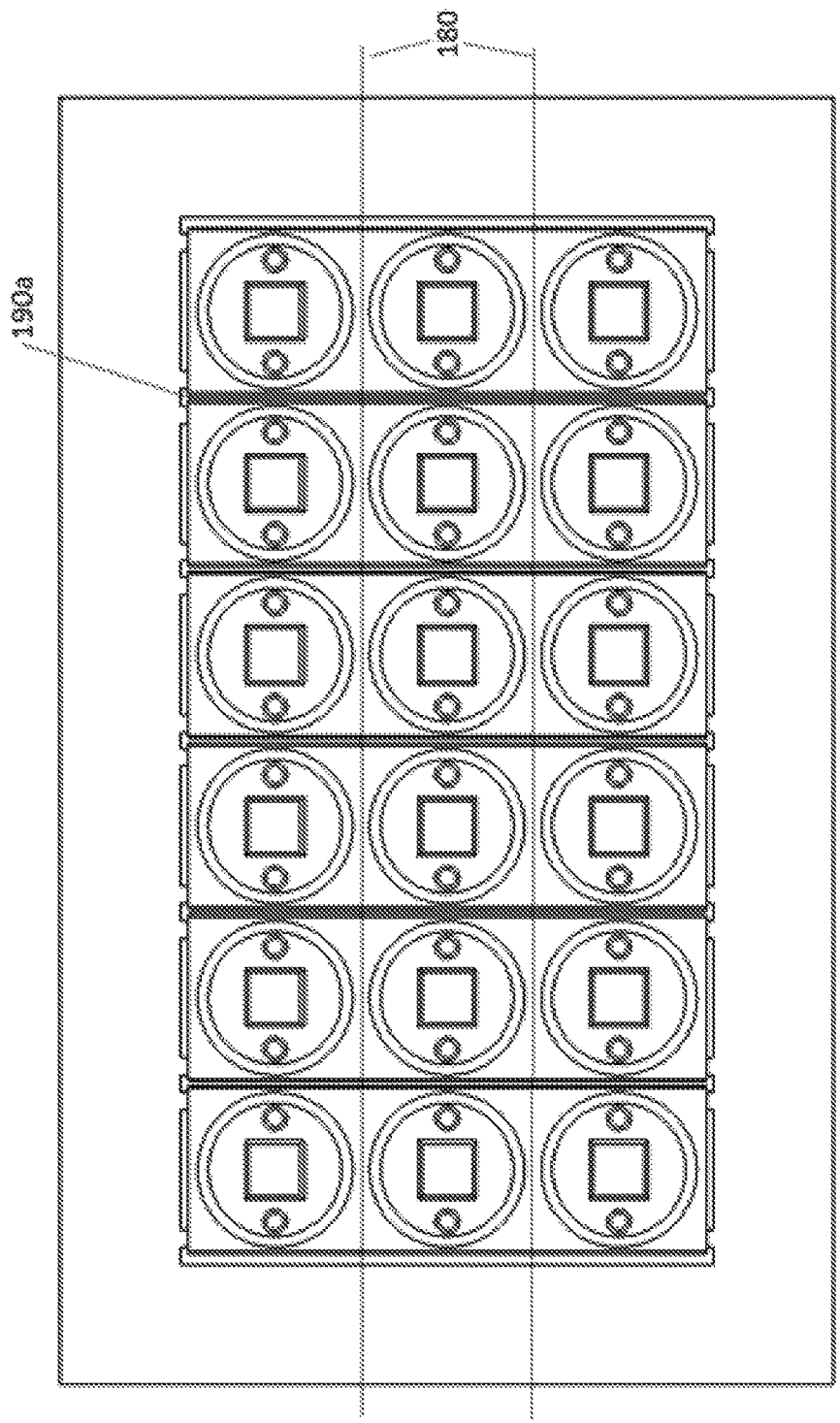
FIG. 4B is a schematic view of a semiconductor package array according to a different embodiment of the invention.
Figure 4C:
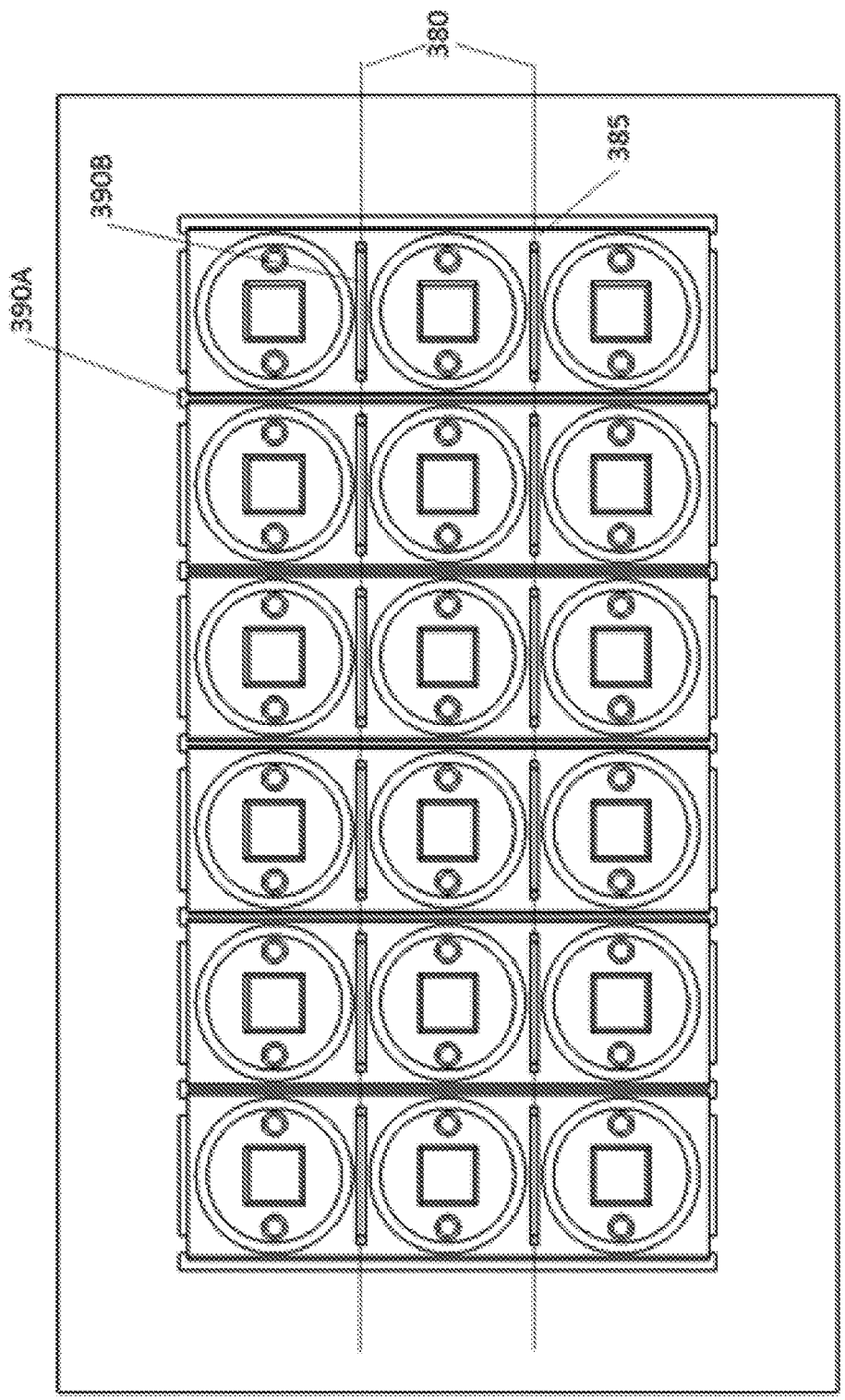
FIG. 4C is a schematic view of a semiconductor package array according to a further different embodiment of the invention.
Figure 4D:
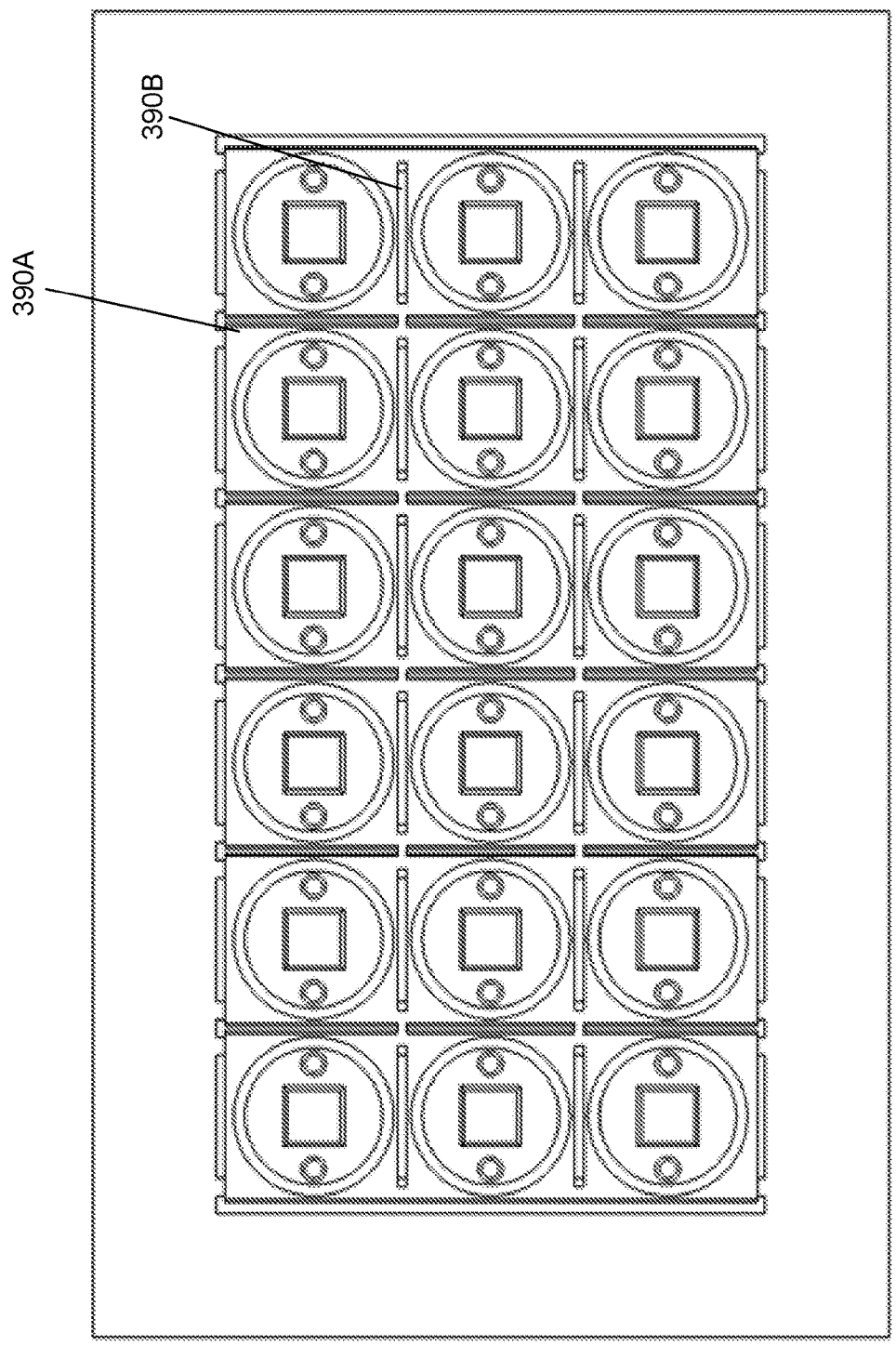
FIG. 4D is a schematic view of a semiconductor package array according to yet a further different embodiment of the invention.

Once the lead frame array is provided, the lead frame array may be used to prepare a semiconductor package array. FIGS. 4A-4D shows different examples of the semiconductor package arrays according to certain embodiments of the invention. Specifically, the semiconductor package array may be made from the lead frame array as shown in either one of FIGS. 3A and 3B. Specifically, for each of the lead frame 111 on the lead frame array 111$f$, the insulating package 120 and the reflective coating layer 122 are formed thereon to form the package body 101. As shown in FIG. 4A, the insulating packages 120 and the reflective coating layers 122 of the package bodies 101 in the array are formed integrally, such that the insulating packages 120 of the adjacent package bodies are continuously connected with each other. In comparison, as shown in FIG. 4B, the resin bodies 120 of the package bodies in the array can be connected in one direction (i.e., the vertical direction) and separated in another orthogonal direction (i.e., the horizontal direction) by slots 190$a$. In this case, the package bodies may be diced by cutting in only one direction along the horizontal lines 180 to reduce cutting time and dirt. FIG. 4C shows another embodiment, where the package bodies may be further divided by additional slots 390A and 390B to reduce the volume to be cut and thus to reduce dirt produced. FIG. 4D shows a further embodiment, which is slightly different from the embodiment as shown in FIG. 4C in that each of the slots 390A are sectioned slots instead of an elongated slot.

Figure 5:
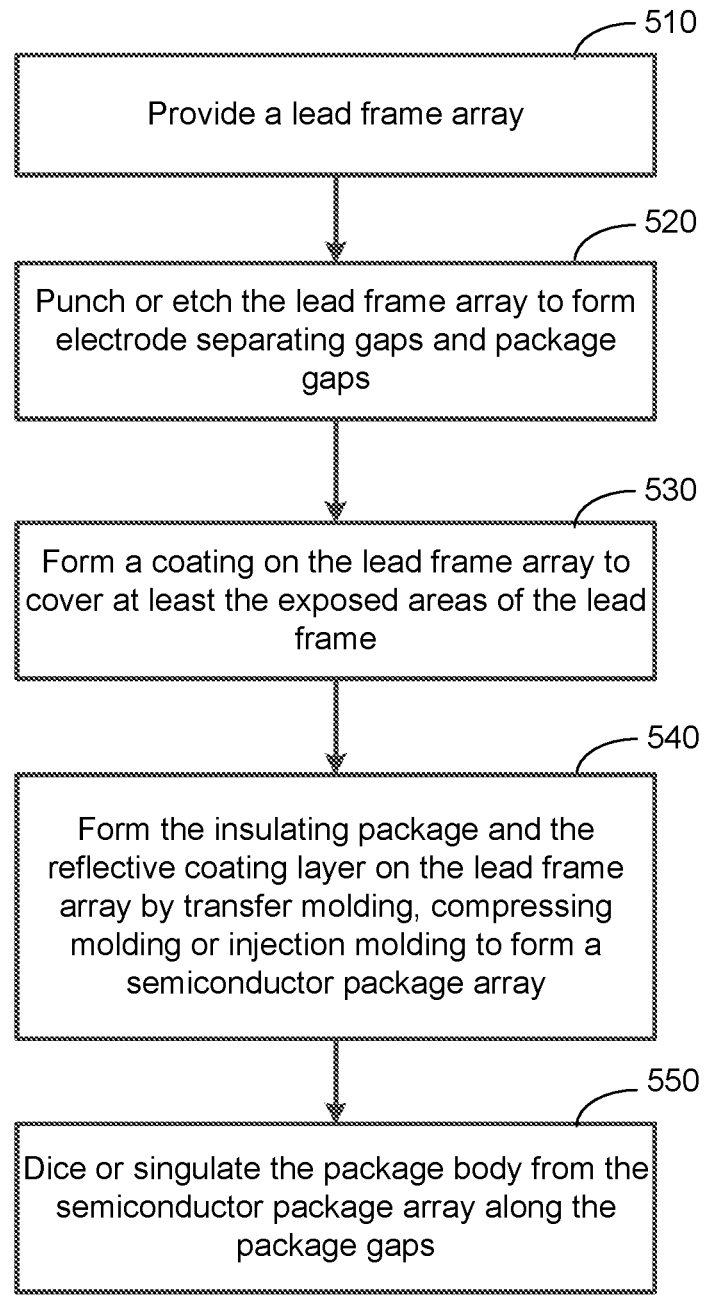
FIG. 5 is a flowchart of a method of forming the package body according to one embodiment of the invention.

A further aspect of the present invention relates to a method for forming a package body as described above. Specifically, as discussed above, the package body may be formed in an array. FIG. 5 is a flowchart of a method of forming the package body according to one embodiment of the invention. In certain embodiments, the method as shown in FIG. 5 may be used to form a package body according to certain embodiments of the invention, such as the package body 101 as shown in FIGS. 2A and 2B. It should be particularly noted that, unless otherwise stated in the present disclosure, the steps of the method or process may be arranged in a different sequential order, and are thus not limited to the sequential order as shown in FIG. 5. Further, the method may include additional steps not shown in the flowchart of FIG. 5.

As shown in FIG. 5, at procedure 510, a lead frame array is provided. Specifically, the lead frame array may be made of a metal sheet. At procedure 520, the lead frame array (i.e., the metal sheet) may be punched or etched to form a plurality of electrode separating gaps and a plurality of package gaps thereon. Specifically, an example of the lead frame array is shown in either FIG. 3A or FIG. 3B, where the slots 111$sp$ and the horizontal slots of the slots 111$sl$ forms the package gaps between the lead frames 111, which may enable less cutting of the lead frames 111 in the dicing or singulating process; and the vertical slot of the slots 111$sl$ forms the electrode separating gap between the two electrodes of each lead frame 111. Optionally, at procedure 530, a coating may be formed on the lead frame array to cover at least the exposed areas (i.e., the openings) of the lead frame. In certain embodiments, the coating may be formed to cover the entire surfaces of the lead frame. At procedure 540, the insulating package and the reflective coating layer are formed on the lead frame array by transfer molding, compressing molding or injection molding to form a semiconductor package array. Specifically, an example of the semiconductor package array is shown in either one of FIGS. 4A-4D. In certain embodiments, additional steps may be performed on the semiconductor package array to make semiconductor packages. The additional steps may include, without being limited thereto, die attaching, wire bonding, and encapsulation, Once the semiconductor package array is ready for cutting, at procedure 550, the package body can be diced or singulated from the package array along the package gaps. In this case, the package body may include a part of one of the electrode separating gaps, which separates the first electrode and the second electrode of the lead frame of package body.

Figure 6:
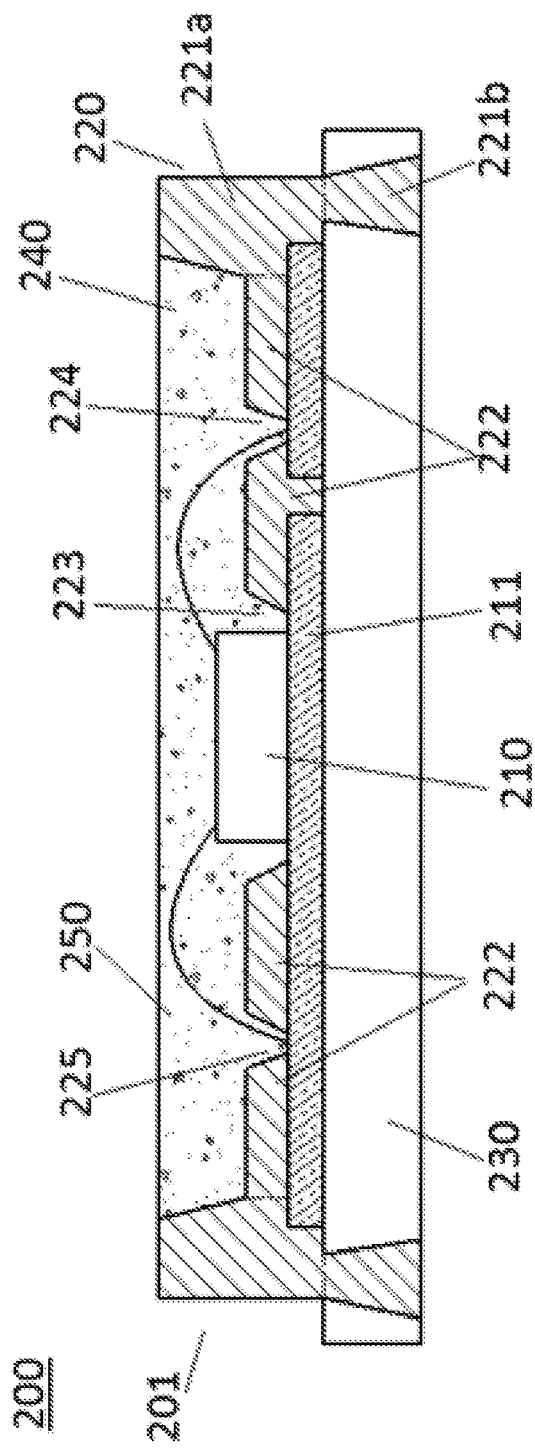
FIG. 6 is a schematic cross-sectional view of a chip-on-board (COB) package structure according to one embodiment of the invention.

In the embodiments as described above, the lead frame package is used as the example of the package body of the semiconductor package. However, similar to the lead frame package, the invention can also be used in a chip-on-board (COB) package to replace silver coating and to improve the reliability as well the performance of a COB package. FIG. 6 is a schematic cross-sectional view of a COB package structure according to one embodiment of the invention. As shown in FIG. 6, the COB package 200 has a similar structure to that of the package body 101 of the semiconductor package 100. Specifically, the COB package 200 includes a package body 201, which functions as a COB housing/body, a semiconductor chip 210 attached in the package body 201, and an optical encapsulating resin layer 250 encapsulating and protecting the semiconductor chip 210. The package body 201 is formed on a substrate 230. Similar to the package body of the semiconductor package 100 as shown in FIGS. 2A and 2B, the package body 201 includes a metal lead 211, an insulating package 220, and a reflective coating layer 222. The semiconductor chip 210 can be any semiconductor chip. The metal lead 211 is bonded on top of the substrate 230 and electrically insulated from the substrate 230. The metal lead 211 includes two electrodes (namely a first electrode and a second electrode) separated and insulated from each other, for providing electrical contacts for the semiconductor chip 210 via the gold wires. The insulating package 220 can be formed on top of the substrate 230 and have a package cavity 240 where the encapsulating material 250 of the COB package 200 is filled. The reflective coating layer 222 is formed on the metal lead 211, and has openings 223, 224, and 225 for semiconductor chip bonding area and wire bonding areas. Specifically, the openings include a chip recess 223, a first recess 225 and a second recess 224. In certain embodiments, the insulating package 220 can be mechanically bond to the substrate 230 through plurality of holes where the resin regions 221b are formed in to prevent detaching of the insulating package 220 from the substrate 230. In certain embodiments, when the COB package 200 includes multiple semiconductor chips 210, the reflective coating layer 222 can have multiple chip recesses 223 to enable the COB semiconductor package 200 with the multiple semiconductor chips 210.

In certain embodiments, the insulating package 220 and the reflective coating layer 222 can be formed in a one-step formation, in which the reflective coating layer 222 is formed together with the electrical-separating region between the two electrodes of the metal lead 211 and the main portion 221a of the insulating package 220. In this case, the insulating package 220 and the reflective coating layer 222 may be made of the same material. For example, the insulating package 220 and the reflective coating layer 222 may be made of the same binder-filler composite. Alternatively, in certain embodiments, the reflective coating layer 222 can be formed separately from other regions of the insulating package 220. For example, the reflective coating layer 222 may be formed by coating on top of the metal lead 211 before the insulating package 220 is formed. In this case, the reflective coating layer 222 and the insulating package 220 can be made of the same material, or can be made of different materials. For example, the reflective coating layer 222 can be made of a binder filler composite different from the binder-filler composite forming the insulating package 220.

In certain embodiments, the invention can also be applied to other lighting structures or applications, such that the metal coating in the lighting structure can be replaced by the binder-filler composite coating. For example, a lamp using diffuse reflectors to reflect light may utilize the binder-filler composite coating structure. Other applications may include, without being limited thereto, remote phosphor applications where the light output of the device greatly depends on the reflectivity of the reflectors.

In certain embodiments, the package body according to certain embodiments of the invention may be used in an encapsulant-free semiconductor package, which does not require the encapsulating resin layer to be filled in the package cavity of the package body. For example, FIGS. 7A-7F show multiple encapsulant-free semiconductor package structures according to certain embodiments of the invention.

Figure 7A:
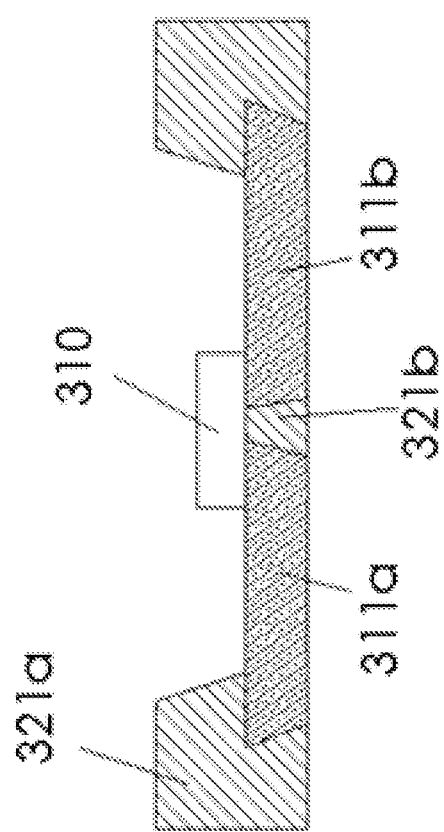
FIG. 7A is a schematic cross-sectional view of an encapsulant-free semiconductor package structure according to one embodiment of the invention.

As shown in FIG. 7A, the encapsulant-free semiconductor package includes a semiconductor chip 310, which is bonded to a pair of electrodes 311a and 311b of a lead frame. Further, an insulating package is formed to include multiple regions 321a and 321b. Specifically, the lateral region 321 forms the main support of the package body, and the bottom region 321b forms between the two electrodes 311a and 311b of the lead frame to electrically insulates the two electrodes 311a and 311b from each other. The semiconductor chip 310 is located directly above the bottom region 321b of the insulating package. It should be noted that there is no encapsulating resin layer as shown in FIG. 7A, leaving the semiconductor chip 310 unprotected.

Figure 7B:
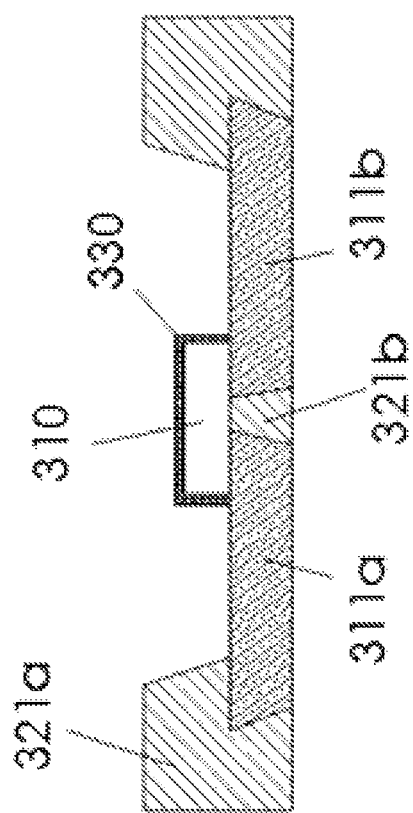
FIG. 7B is a schematic cross-sectional view of an encapsulant-free semiconductor package structure according to another embodiment of the invention.

FIG. 7B shows an encapsulant-free semiconductor package which is very similar to that as shown in FIG. 7A, with the only difference being that the semiconductor chip 310 as shown in FIG. 7B is protected with a thin encapsulating layer 330. The thin encapsulating layer 330 is a thin layer, which does not fill the package cavity. The thin layer can be made of an optical transparent material such as silicones or polymers. In certain embodiments, the thin layer can contain white pigments that are made of at least one selected from the group consisting of $TiO_2$, $SiO_2$, $Al_2O_3$, BN, MgO, CaO, $ZrO_2$, ZnO, BaO, AlN, $Sb_2O_3$, and $BaSO_4$. In certain embodiments, the thin layer can contain wavelength conversion materials such as phosphor materials and/or quantum dot materials.

Figure 7C:
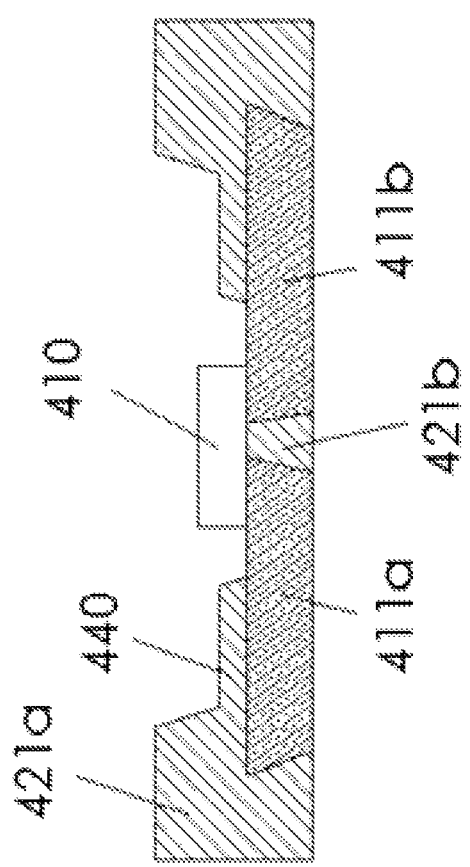
FIG. 7C is a schematic cross-sectional view of an encapsulant-free semiconductor package structure according to a further embodiment of the invention.

As shown in FIG. 7C, the encapsulant-free semiconductor package includes a semiconductor chip 410, which is bonded to a pair of electrodes 411a and 411b of a lead frame. Further, an insulating package is formed to include multiple regions 421a and 421b. Specifically, the lateral region 421 forms the main support of the package body, and the bottom region 421*b* forms between the two electrodes 411*a* and 411*b* of the lead frame to electrically insulates the two electrodes 411*a* and 411*b* from each other. The semiconductor chip 410 is located directly above the bottom region 421*b* of the insulating package. Moreover, a reflective coating layer 440 is formed on the electrodes 411*a* and 411*b* of the lead frame It should be noted that there is no encapsulating resin layer as shown in FIG. 7C, leaving the semiconductor chip 410 unprotected.

Figure 7D:
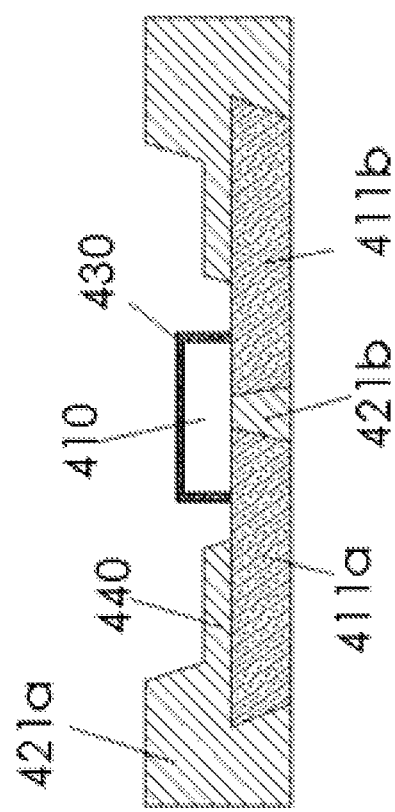
FIG. 7D is a schematic cross-sectional view of an encapsulant-free semiconductor package structure according to yet another embodiment of the invention.

FIG. 7D shows an encapsulant-free semiconductor package which is very similar to that as shown in FIG. 7C, with the only difference being that the semiconductor chip 410 as shown in FIG. 7D is protected with a thin encapsulating layer 430. The thin encapsulating layer 430 is a thin layer, which does not fill the package cavity. The thin layer can be similar to the thin encapsulating layer 330 as shown in FIG. 7B.

As shown in FIGS. 7C and 7D, the semiconductor chip 410 is attached to the electrodes 411*a* and 411*b* via a single recess. In certain embodiments, the encapsulant-free semiconductor package may include multiple recesses, such that multiple semiconductor chips may be provided and respectively attached to the electrodes via the multiple recesses.

Figure 7E:
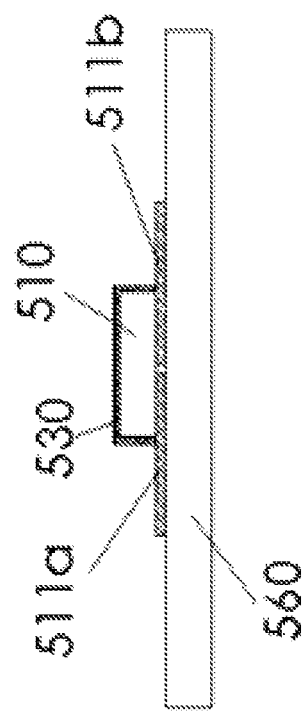
FIG. 7E is a schematic cross-sectional view of an encapsulant-free semiconductor package structure according to yet a further embodiment of the invention.

FIG. 7E shows an encapsulant-free semiconductor package using a COB package structure. As shown in FIG. 7E, the encapsulant-free semiconductor package includes a semiconductor flip-chip 510, which is bonded to a pair of electrodes 511*a* and 511*b* of a lead frame. The lead frame (i.e., the electrodes 511*a* and 511*b*) is formed on a substrate 560. Further, the semiconductor flip-chip 510 is protected with a thin encapsulating layer 530. The thin encapsulating layer 530 is a thin layer, which can be similar to the thin encapsulating layer 330 as shown in FIG. 7B. In certain embodiments, the semiconductor flip-chip 510 can be a LED flip-chip or a LD flip-chip, which is configured to emit a blue light, a green light, a red light or a white light.

Figure 7F:
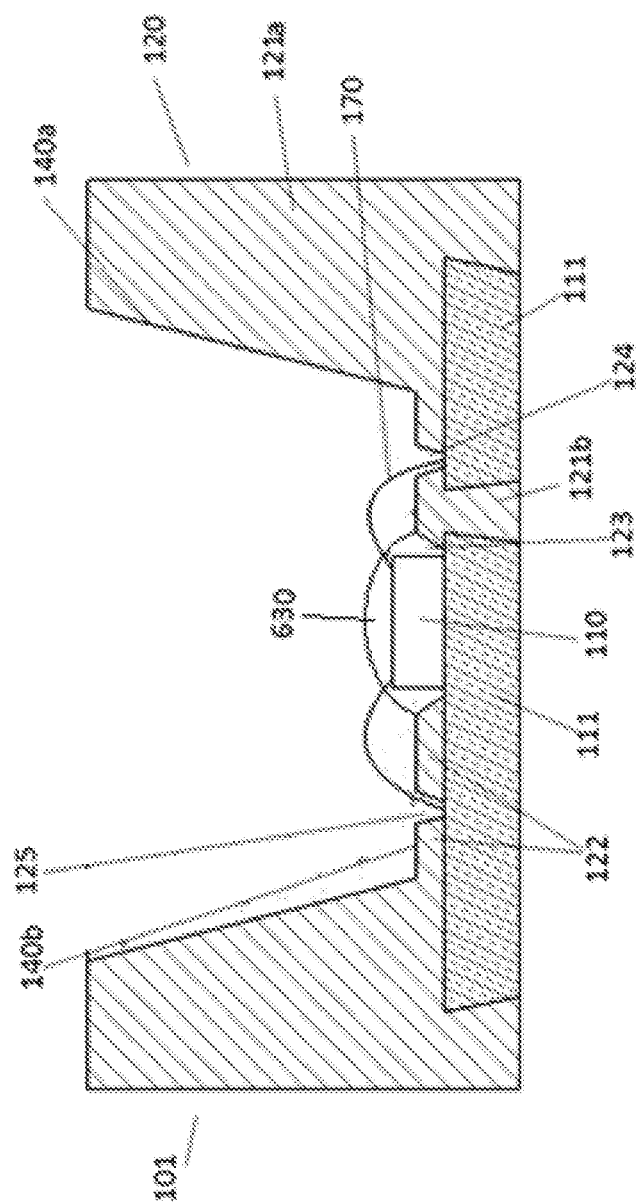
FIG. 7F is a schematic cross-sectional view of an encapsulant-free semiconductor package structure according to a further embodiment of the invention.

FIG. 7F shows an encapsulant-free semiconductor package, which has a lead frame package structure that is similar to the structure as shown in FIG. 2B. Specifically, the semiconductor chip 110 as shown in FIG. 7F is a wire-bonding chip, which is the same as that as shown in FIG. 2B. The structure as shown in FIG. 7F is different from the structure as shown in FIG. 2B in that a thin encapsulating layer 630 is provided to replaces for the encapsulant resin layer 150 as shown in FIG. 2B. In other words, the encapsulant resin layer 150 and the fillers 160 of the package 100 as shown in FIG. 2B are removed and replaced by the thin encapsulating layer 630 to form the encapsulant-free semiconductor package as shown in FIG. 7F. The thin encapsulating layer 630 is a thin layer, which does not fill the package cavity, and can be similar to the thin encapsulating layer 330 as shown in FIG. 7B. In certain embodiments, the structure as shown in FIG. 7F may be used as a semiconductor emitter.

In certain embodiments, by removing the encapsulant resin layer 150 that is filled within the package cavity as shown in FIG. 2B, thermal dissipation of a semiconductor package could be improved. Junction temperature and light output of an encapsulant-free semiconductor package are found to be improved (lower junction temperature and higher light output) compared to an encapsulated semiconductor package. Moreover, the encapsulant-free semiconductor package also reduces processing steps and thus enables low cost.

In certain embodiments, the thin encapsulating layers 330, 430, 530 and 630 may be made of a light conversion material to partially convert the light emitted by the semiconductor flip-chip to a different color. Using the COB structure as shown in FIG. 7E as an example, the semiconductor flip-chip 510 may emit light in a first color, and the thin encapsulating layer 530 may convert the light to a different second color.

Figure 8:
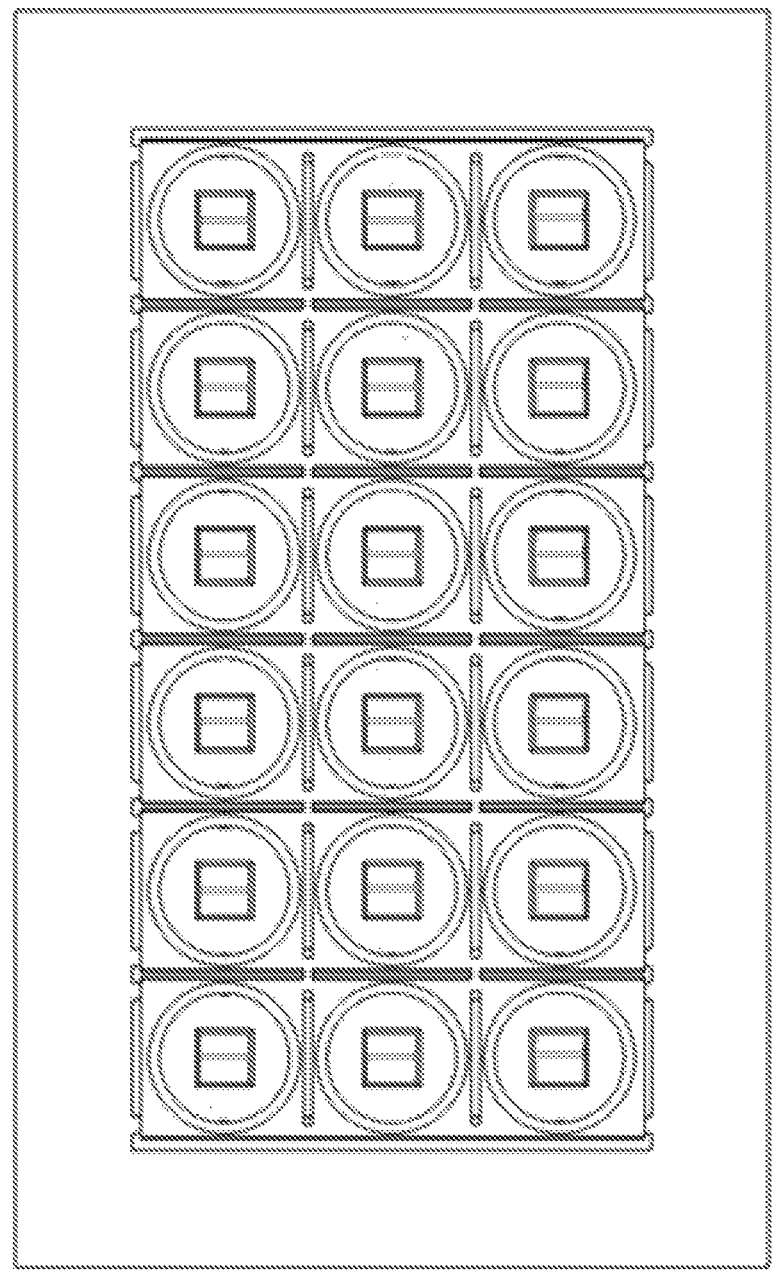
FIG. 8 is a schematic view of a semiconductor package array for the encapsulant-free semiconductor packages according to one embodiment of the invention.

For mass production, the lead frame package for the encapsulant-free semiconductor package can be made in an array, such as the array as shown in FIG. 3A or FIG. 3B. Mass production schemes as shown in FIGS. 4A-4D can be used for any one of the encapsulant-free semiconductor packages as shown in FIGS. 7A-7F. FIG. 8 is an example of the lead frame package array of mass production for encapsulant-free semiconductor package shown in FIGS. 7C-D. For example, FIG. 8 is a schematic view of a semiconductor package array for the encapsulant-free semiconductor packages according to one embodiment of the invention. Specifically, the semiconductor package array as shown in FIG. 8 is similar to the semiconductor package array as shown in FIG. 4D, with the difference being that the semiconductor packages as shown in FIG. 8 are encapsulant-free semiconductor packages.

In certain embodiments, the semiconductor chip as used in certain embodiments of the invention can be any of semiconductor chips that emit or receive light, such as light emitting diodes, laser diodes, vertical-cavity-surface-emitting lasers, optical sensors/detectors, or other suitable chips.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments are chosen and described in order to explain the principles of the disclosure and their practical application so as to activate others skilled in the art to utilize the disclosure and various embodiments and with various modifications as are suited to the particular use contemplated. Alternative embodiments will become apparent to those skilled in the art to which the present disclosure pertains without departing from its spirit and scope. Accordingly, the scope of the present disclosure is defined by the appended claims rather than the foregoing description and the exemplary embodiments described therein.

What is claimed is:

1. A package body for a semiconductor device, comprising:
   a lead frame having a first electrode and a second electrode separated from each other;
   an insulating package providing a housing structure and forming a package cavity therein, wherein the package cavity has a reflective side surface formed by the insulating package; and
   a reflective coating layer partially covering the first electrode and the second electrode and forming a reflective bottom surface of the package cavity,
   wherein at least one semiconductor chip is configured to be attached to the first electrode and electrically connected to the first electrode and the second electrode respectively; and
   wherein the reflective coating layer has a first recess, a second recess and at least one chip recess formed thereon, wherein:
   a portion of the lead frame is exposed through each of the at least one chip recess to provide a chip-attaching area, such that the at least one semiconductor chip is attached to the lead frame via the at least one chip recess;

a portion of the first electrode is exposed through the first recess to provide a wire-bonding area, such that each of the at least one semiconductor chip is electrically connected to the first electrode through a first wire via the first recess; and a portion of the second electrode is exposed through the second recess to provide a wire-bonding area, such that each of the at least one semiconductor chip is electrically connected to the second electrode through a second wire via the second recess.

2. The package body according to claim 1, being an all diffusive integrated reflecting surfaces (AR-IRS) package body.

3. The package body according to claim 1, wherein the first electrode and the second electrode are separated by the insulating package.

4. The package body according to claim 1, wherein each of the first electrode and the second electrode has an angled cut such that a bottom surface area of the first electrode is smaller than a top surface area of the first electrode, and a bottom surface area of the second electrode is smaller than a top surface area of the second electrode.

5. The package body according to claim 1, wherein each of the first electrode and the second electrode has a vertical cut.

6. The package body according to claim 1, wherein the at least one semiconductor chip comprises a light emitting diode (LED) chip or a laser diode (LD) chip.

7. The package body according to claim 1, wherein the insulating package is made of a binder-filler composite containing white pigments.

8. The package body according to claim 7, wherein the binder-filler composite is polycyclohexylenedimethylene terephthalate (PCT), polyphthalamide (PPA), a silicone resin, a silicone molding resin, an epoxy molding resin, an acrylate resin, an urethane resin, or a copolymer system thereof, and the white pigments are made of at least one pigment selected from the group consisting of $TiO_2$, $SiO_2$, $Al_2O_3$, BN, MgO, CaO, $ZrO_2$, ZnO, BaO, AlN, $Sb_2O_3$, and $BaSO_4$.

9. The package body according to claim 8, wherein the white pigments are amorphous, partially crystalline, crystalline or a mixture thereof in any ratio, and the white pigments have a weight ratio from 1 to 95 percent of the binder-filler composite forming the insulating package.

10. The package body according to claim 8, wherein each of the white pigments has a size from 10 nm to 10 microns.

11. The package body according to claim 7, wherein the reflective coating layer is made of the same binder-filler composite forming the insulating package.

12. The package body according to claim 7, wherein the reflective coating layer is made of a binder filler composite different from the binder-filler composite forming the insulating package.

13. An encapsulant-free semiconductor package, comprising:
a semiconductor flip-chip; and
a package body according to claim 1.

14. The encapsulant-free semiconductor package according to claim 13, wherein the semiconductor flip-chip is a light emitting diode (LED) flip-chip or a laser diode (LD) flip-chip.

15. The encapsulant-free semiconductor package according to claim 14, wherein the LED flip-chip or the LD flip-chip is configured to emit a blue light, a green light, a red light or a white light.

16. The encapsulant-free semiconductor package according to claim 13, wherein the semiconductor flip-chip is coated with a thin coating of a transparent material.

17. The encapsulant-free semiconductor package according to claim 16, wherein the semiconductor flip-chip is configured to emit light in a first color, and the transparent material comprises a light conversion material to partially convert the light emitted by the semiconductor flip-chip to a second color different from the first color.

18. A method for forming a package body according to claim 1, comprising:
providing a lead frame array;
punching or etching the lead frame array to form a plurality of electrode separating gaps and a plurality of package gaps;
forming the insulating package and the reflective coating layer on the lead frame array to form a semiconductor package array; and
dicing or singulating the package body from the package array along the package gaps,
wherein one of the electrode separating gaps separates the first electrode and the second electrode of the lead frame of the package body.

19. The method according to claim 18, further comprising:
forming a coating on the lead frame array to cover at least exposed areas of the lead frame of the package body.

20. The method according to claim 18, wherein the insulating package and the reflective coating layer are formed by transfer molding, compressing molding or injection molding.

21. A light emitting diode (LED) device, comprising:
the package body according to claim 1; and
a LED chip attached to the package body.

22. A package body for a semiconductor device, comprising:
a substrate;
a first electrode and a second electrode formed on the substrate and separated from each other;
an insulating package providing a housing structure and forming a package cavity therein, wherein the package cavity has a reflective side surface formed by the insulating package; and
a reflective coating layer forming a reflective bottom surface of the package cavity and partially covering the first electrode and the second electrode,
wherein a semiconductor flip-chip is configured to be attached to the first electrode and the second electrode respectively; and
wherein the reflective coating layer has at least one recess formed thereon, and a portion of the first electrode and a portion of the second electrode of the lead frame are exposed through the at least one recess to provide a bonding pad area, such that the semiconductor flip-chip is attached to the first electrode and the second electrode via the at least one recess.

23. The package body according to claim 22, wherein the first electrode and the second electrode are formed by a lead frame.

24. A package body for a semiconductor device, comprising:
a substrate;
a first electrode and a second electrode formed on the substrate and separated from each other;

an insulating package providing a housing structure and forming a package cavity therein, wherein the package cavity has a reflective side surface formed by the insulating package; and a reflective coating layer forming a reflective bottom surface of the package cavity and partially covering the first electrode and the second electrode, wherein at least one semiconductor chip is configured to be attached to the first electrode and electrically connected to the first electrode and the second electrode respectively; and wherein the reflective coating layer has a first recess, a second recess and at least one chip recess formed thereon, wherein:

a portion of the lead frame is exposed through each of the at least one chip recess to provide a chip-attaching area, such that the at least one semiconductor chip is attached to the lead frame via the at least one chip recess;

a portion of the first electrode is exposed through the first recess to provide a wire-bonding area, such that each of the at least one semiconductor chip is electrically connected to the first electrode through a first wire via the first recess; and a portion of the second electrode is exposed through the second recess to provide a wire-bonding area, such that each of the at least one semiconductor chip is electrically connected to the second electrode through a second wire via the second recess.

\* \* \* \* \*